(12) United States Patent
Lee et al.

(10) Patent No.: US 9,536,983 B2
(45) Date of Patent: Jan. 3, 2017

(54) METHODS OF MANUFACTURING SEMICONDUCTOR DEVICES INCLUDING GATE PATTERNS WITH SIDEWALL SPACERS AND CAPPING PATTERNS ON THE SIDEWALL SPACERS

(71) Applicant: Samsung Electronics Co., Ltd.

(72) Inventors: Doo-Young Lee, Seoul (KR); Dohyoung Kim, Hwaseong-si (KR); Johnsoo Kim, Hwaseong-si (KR); Heungsik Park, Yongin-si (KR); Hongsik Shin, Seoul (KR); Younghun Choi, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/970,710

(22) Filed: Dec. 16, 2015

(65) Prior Publication Data

US 2016/0233310 A1  Aug. 11, 2016

(30) Foreign Application Priority Data

Feb. 10, 2015  (KR) .......................... 10-2015-0020255

(51) Int. Cl.
  *H01L 29/66* (2006.01)
  *H01L 29/423* (2006.01)
  *H01L 29/40* (2006.01)

(52) U.S. Cl.
  CPC ......... *H01L 29/6656* (2013.01); *H01L 29/401* (2013.01); *H01L 29/4232* (2013.01); *H01L 29/6653* (2013.01)

(58) Field of Classification Search
  CPC ............. H01L 29/6656; H01L 29/4232; H01L 29/401; H01L 29/6653
  See application file for complete search history.

(56) References Cited

U.S. PATENT DOCUMENTS

| | | | |
|---|---|---|---|
| 6,607,955 B2 | 8/2003 | Lee | |
| 7,932,166 B2 | 4/2011 | Frohberg et al. | |
| 8,048,790 B2 | 11/2011 | Soss et al. | |
| 8,093,120 B2 | 1/2012 | Yeh et al. | |
| 8,227,890 B2 | 7/2012 | Lin et al. | |
| 8,426,300 B2 | 4/2013 | Ramachandran et al. | |
| 8,440,533 B2 | 5/2013 | Toh et al. | |
| 8,642,473 B2 | 2/2014 | Chang et al. | |
| 8,679,968 B2 | 3/2014 | Xie et al. | |
| 8,741,723 B2 | 6/2014 | Chi | |
| 9,093,467 B1* | 7/2015 | Xie | ................... H01L 29/66545 |
| 2006/0051968 A1 | 3/2006 | Joshi et al. | |
| 2011/0217824 A1* | 9/2011 | Ohuchi | ................... H01L 21/02 438/382 |
| 2013/0234253 A1 | 9/2013 | Toh et al. | |

(Continued)

FOREIGN PATENT DOCUMENTS

KR 1020050058118  6/2005
KR 1020050071787  7/2005

*Primary Examiner* — Michael Jung
(74) *Attorney, Agent, or Firm* — Myers Bigel, P.A.

(57) ABSTRACT

A method of forming a semiconductor device includes forming a gate electrode on a substrate, forming a first spacer on a sidewall of the gate electrode, forming a second spacer on the first spacer, and forming a capping pattern on top surfaces of the gate electrode, the first spacer and the second spacer. An outer sidewall of the second spacer is vertically aligned with a sidewall of the capping pattern.

19 Claims, 8 Drawing Sheets

(56) References Cited

U.S. PATENT DOCUMENTS

| | | | |
|---|---|---|---|
| 2014/0199836 A1* | 7/2014 | Chen | H01L 21/76819 438/675 |
| 2015/0041905 A1* | 2/2015 | Xie | H01L 29/6656 257/369 |
| 2015/0221740 A1* | 8/2015 | Alptekin | H01L 29/456 257/288 |
| 2015/0279996 A1* | 10/2015 | He | H01L 29/7851 257/288 |

* cited by examiner

METHODS OF MANUFACTURING SEMICONDUCTOR DEVICES INCLUDING GATE PATTERNS WITH SIDEWALL SPACERS AND CAPPING PATTERNS ON THE SIDEWALL SPACERS

CROSS-REFERENCE TO RELATED APPLICATION

This U.S. non-provisional patent application claims priority under 35 U.S.C. §119 to Korean Patent Application No. 10-2015-0020255, filed on Feb. 10, 2015, the entire contents of which are hereby incorporated by reference.

BACKGROUND

The inventive concepts relate to semiconductor devices and methods of manufacturing the same, and more particularly, to semiconductor devices including FET (field effect transistor) structures and methods of manufacturing the same.

A semiconductor device may include an integrated circuit including a plurality of MOSFETs (metal oxide semiconductor FETs). As the design rule of MOSFETs decreases, the sizes of MOSFETs are gradually being reduced. Reducing the size of a MOSFET may cause a short channel effect, which can degrade the operational characteristics of a semiconductor device. Accordingly, various methods of forming semiconductor devices that can overcome limitations due to increased integration are being studied.

SUMMARY

Embodiments of the inventive concepts provide methods of forming semiconductor devices. The manufacturing methods may include forming a gate electrode on a substrate, forming a first spacer on a sidewall of the gate electrode, forming a gate dielectric pattern between the gate electrode and the first spacer, forming a second spacer that is spaced apart from the gate electrode on an outer sidewall of the first spacer, wherein the first spacer is interposed between the second spacer and the gate electrode, and forming a capping pattern which is provided on a top surface of the gate electrode and extends on top surfaces of the first spacer and the second spacer. A sidewall of the capping pattern is aligned with an outer sidewall of the second spacer. A lower portion of the outer sidewall of the first spacer may be exposed by the second spacer and may be aligned with the sidewall of the capping pattern.

The methods may further include forming an insulating layer on the substrate including the gate electrode, the capping pattern and the first and second spacers, and etching the insulating layer to form a contact hole adjacent the capping pattern and the first and second spacers, wherein the capping pattern and the second spacer have an etch selectivity with respect to the first spacer.

Etching the insulating layer may include anisotropically etching the insulating layer using a fluorine-based etching gas.

The method may further comprises forming a contact filling the contact hole, wherein an upper portion of the contact overlaps with the second spacer in a plan view.

In embodiments of the inventive concepts, the top surfaces of the gate electrode, the first spacer and the second spacer may be in the same level (i.e., coplanar).

In embodiments of the inventive concepts, the capping pattern may be in contact with the top surfaces of the gate electrode, the first spacer and the second spacer.

In embodiments of the inventive concepts, the second spacer and the capping pattern may comprise the same material, and the first spacer may comprise different material from the second spacer and the capping pattern.

In embodiments of the inventive concepts, oxygen concentration in the second spacer and the capping pattern may be lower than oxygen concentration in the first spacer.

In embodiments of the inventive concepts, the first spacer may comprise SiOCN and the second spacer and the capping pattern may comprise SiN.

In embodiments of the inventive concepts, the gate dielectric pattern may extend between the substrate and the gate electrode.

The method may further include forming a contact adjacent to a sidewall of the gate electrode and electrically connected to the substrate. The contact may be in contact with the sidewall of the capping pattern, the outer sidewall of the second spacer, and the lower portion of the outer sidewall of the first spacer.

Further embodiments of the inventive concepts provide a methods of forming semiconductor devices including forming a dummy gate pattern on a substrate, forming first spacers on opposite sidewalls of the dummy gate pattern, forming second spacers on outer sidewalls of the first spacers, forming an interlayer insulating layer on the dummy gate pattern, the first spacers, the second spacers, the substrate, forming a gap region between the first spacers by removing the dummy gate pattern, forming a gate electrode filling a portion of the gap region, removing upper portions of the first spacers and upper portions of the second spacers to form a recess region that exposes an inner sidewall of the interlayer insulating layer, and forming a capping pattern in the recess region to cover the gate electrode, the first spacers, and the second spacers.

In embodiments of the inventive concepts, the second spacer and the capping pattern may be formed of the same material, and the first spacer may be formed of different material from the second spacer and the capping pattern.

In embodiments of the inventive concepts, removing the upper portions of the first spacers and the upper portions of the second spacers may include performing an etching process so that a top surface of the gate electrode, top surfaces of the first spacers and top surfaces of the second spacers are located on the same plane.

In embodiments of the inventive concepts, the recess region may be defined by a top surface of the gate electrode, top surfaces of the first spacers and top surfaces of the second spacers.

In embodiments of the inventive concepts, forming a gate electrode in a portion of the gap region may comprise forming a gate electrode layer filling the gap region, planarizing the gate electrode layer until a top surface the interlayer insulating layer is exposed, and removing the upper portion of the gate electrode layer in the gap region.

The method may further include forming a contact hole in the interlayer insulating layer adjacent to one sidewall of the gate electrode. The patterning process is performed using an etching condition having an etching selectivity with respect to the capping pattern and the second spacer.

In embodiments of the inventive concepts, an outer sidewall of each first space may be in contact with an inner sidewall of each second spacer and an outer sidewall of each second spacer may be aligned with a sidewall of the capping pattern.

In embodiments of the inventive concepts, a lower outer sidewall of each first spacer may be aligned with the outer sidewall of each second spacer.

Methods of forming a semiconductor device according to further embodiments forming a device isolation layer defining an active pattern which protrudes from a substrate, forming a gate electrode crossing the active pattern and the device isolation layer, forming first spacers on both sidewalls of the gate electrode, forming second spacers on the opposite sidewalls of the gate electrode and being spaced apart from gate electrode, wherein the first spacers are interposed between the second spacers and the gate electrode, and forming a capping pattern on top surfaces of the gate electrode, the first spacers, and the second spacers. The first and second spacers and the capping pattern cross the active pattern and the device isolation layer and each second spacer has an inner sidewall adjacent to the gate electrode and an outer sidewall facing the inner sidewall. The outer sidewalls of the second spacers are aligned with both sidewalls of the capping pattern, respectively.

In embodiments of the inventive concepts, the capping pattern may be in contact with top surfaces of the gate electrode, the first spacers, and the second spacers.

The methods may further include forming contacts adjacent to the both sidewalls of the gate electrode to be electrically connected to the active pattern. The contacts may be in contact with the capping pattern, the second spacers, and lower portions of the first spacers.

The methods may further include forming an interlayer insulating layer covering the gate electrode, the first spacers, the second spacers, and the capping pattern on the substrate, and forming contacts penetrating the interlayer insulating layer adjacent to the both sidewalls of the gate electrode to be electrically connected to the active pattern. The capping pattern, the second spacers, and lower portions of the first spacers may be in contact with the contacts on the active pattern. The capping pattern, the second spacers, and lower portions of the first spacers may be in contact with the interlayer insulating layer on the device isolation layer.

In embodiments of the inventive concepts, the capping pattern may have a lengthwise width along a direction in which the active pattern extends. On the active pattern, a width of an upper portion of the capping pattern may be smaller than a width of a lower portion of the capping pattern. On the device isolation layer, the width of the upper portion of the capping pattern may be the same as the width of the lower portion of the capping pattern.

BRIEF DESCRIPTION OF THE DRAWINGS

Preferred embodiments of the inventive concepts will be described below in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art. Like numbers refer to like elements throughout.

FIGS. 3A through 7A are cross sectional views taken along the line I-I' of FIG. 1, which explain a manufacturing method of a semiconductor device in accordance with an embodiment of the inventive concepts.

FIGS. 3B through 7B are cross sectional views taken along the line II-II' of FIG. 1, which explain a manufacturing method of a semiconductor device in accordance with an embodiment of the inventive concepts.

DETAILED DESCRIPTION

Figure 1:
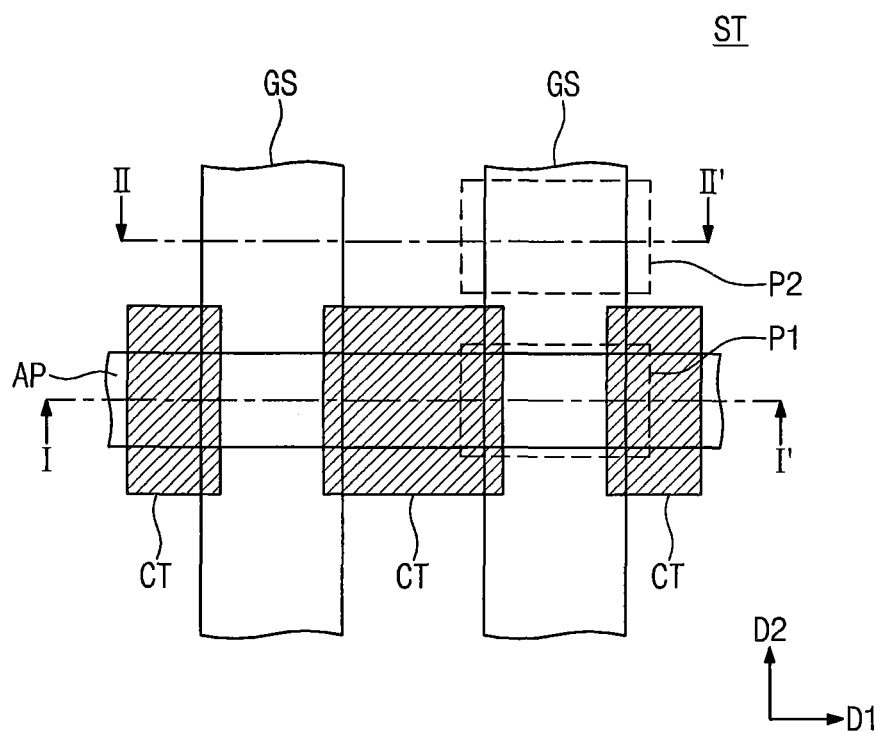
FIG. 1 is a top plan view of a semiconductor device in accordance with an embodiment of the inventive concepts.

Embodiments of inventive concepts will be described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

In the drawings, it will be understood that when an element such as a layer, region or substrate is referred to as being "on" or "onto" another element, it may lie directly on the other element or intervening elements or layers may also be present. Like reference numerals refer to like elements throughout the specification.

Embodiments of the inventive concepts may be described with reference to cross-sectional illustrations, which are schematic illustrations of idealized embodiments of the present invention. Thus, the regions illustrated in the figures are schematic in nature and are not intended to limit the scope of the present invention. It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 2A:
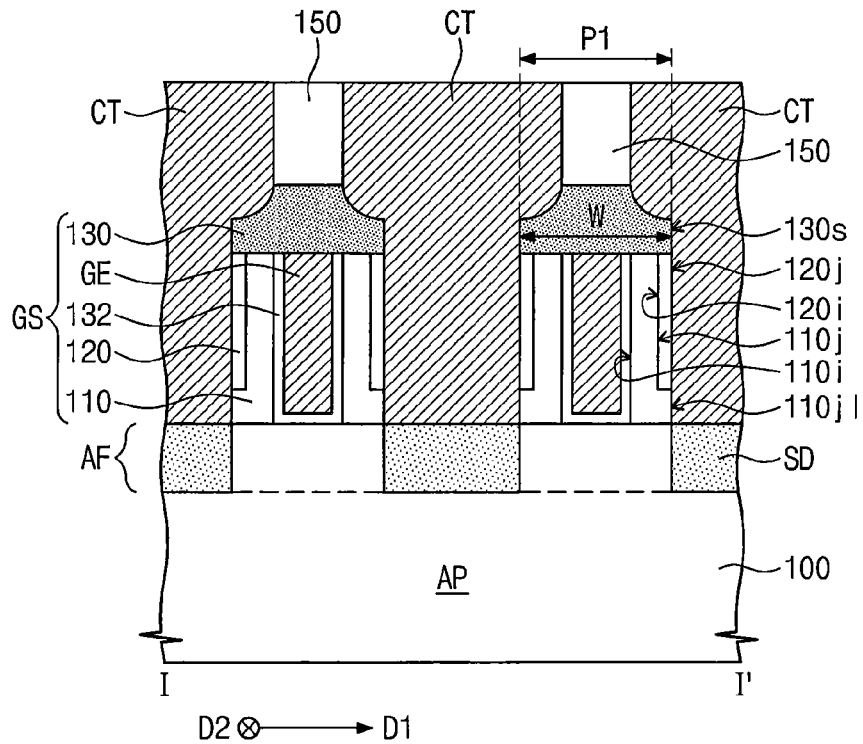
FIGS. 2A and 2B are cross sectional views taken along the lines I-I' and II-II' of FIG. 1, respectively.
Figure 2B:
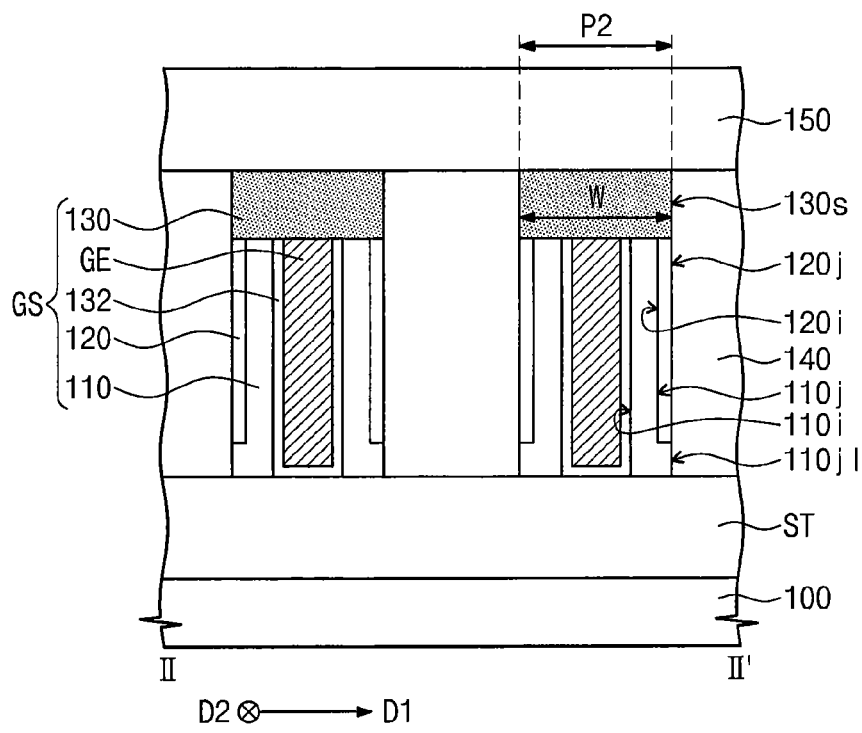

FIG. 1 is a top plan view of a semiconductor device in accordance with an embodiment of the inventive concepts. FIGS. 2A and 2B are cross sectional views taken along the lines I-I' and II-II' of FIG. 1, respectively.

Referring to FIGS. 1, 2A and 2B, a device isolation layer ST that defines an active pattern AP may be provided on a substrate 100. The substrate 100 may be a silicon substrate, a germanium substrate, or a SOI (silicon on insulator) substrate. The device isolation layer ST may include, for example, an oxide, a nitride and/or an oxynitride. The active pattern AP may extend in a first direction D1 (e.g., a lengthwise direction). According to some embodiments, the active pattern AP may include an upper region (hereinafter referred to as 'active fin AF') that is exposed by the device isolation layer ST. According to other embodiments, a top surface of the device isolation layer ST may substantially be coplanar with a top surface of the active pattern AP.

A gate structure GS may cross the active pattern AP and the device isolation layer ST. The gate structure GS may extend in a second direction D2 that crosses the first direction D1. A plurality of gate structure GS may be provided on the substrate 100. Each of the gate structures GS may cross the active pattern AP, and the gate structures GS may be spaced apart from one another along the first direction D1.

The gate structure GS may include a gate electrode GE that crosses the active pattern AP, first spacers 110 on opposing sidewalls of the gate electrode GE, second spacers 120 which are provided on opposing sidewalls of the gate electrode GE and are spaced apart from the gate electrode GE with the first spacers 110 interposed therebetween, a capping pattern 130 on the gate electrode GE, and a gate dielectric pattern 132 between the gate electrode GE and the substrate 100.

The capping pattern 130 may be provided on a top surface of the gate electrode GE, and may extend onto top surfaces of the first spacers 110 and at least partially onto top surfaces of the second spacers 120, so that the capping pattern 130 and the second spacers 120 may cover upper portions of the first spacers 110. According to some embodiments, the top surface of the gate electrode GE, the top surfaces of the first spacers 110 and the top surfaces of the second spacers 120 may be substantially located on the same plane (i.e. may be coplanar). For example, the top surface of the gate electrode GE, the top surfaces of the first spacers 110 and the top surfaces of the second spacers 120 may be substantially located at the same level above the substrate 100. The capping pattern 130 may directly contact the top surface of the gate electrode GE, the top surfaces of the first spacers 110 and the top surfaces of the second spacers 120.

Each of the second spacers 120 may have an inner sidewall 120i adjacent to the gate electrode GE and an outer sidewall 120j facing the inner sidewall 120i. In a sectional view, the outer sidewalls 120j of the second spacers 120 may be aligned with corresponding sidewalls 130s of the capping pattern 130. Each of the first spacers 110 may have an inner sidewall 110i that directly contacts the gate dielectric pattern 132 and an outer sidewall 110j that faces the inner sidewall 110i and is in contact with the inner sidewall 120i of each of the second spacers 120. A lower outer sidewall 110j1 of each first spacer 110 may be exposed by each second spacer 120. The lower outer sidewall 110j1 of each first spacer 110 may be aligned with the outer sidewall 120j of each second spacer 120.

The first spacers 110 may have a first width adjacent the second spacers 120 and a second width beneath the second spacers 120 and adjacent the lower outer sidewalls thereof. The first width may be less than the second width.

According to some embodiments, the gate dielectric pattern 132 may extend between the gate electrode GE and the first spacers 110. In this case, a top surface of the gate dielectric layer 132 and the top surface of the gate electrode GE may be substantially coplanar. For example, the top surface of the gate dielectric layer 132 and the top surface of the gate electrode GE may be substantially located at the same level above the substrate 100. In this case, the capping pattern 130 may directly contact the top surface of the gate dielectric layer 132 as well as the top surface of the gate electrode GE.

The capping pattern 130 may include substantially the same material as the second spacers 120. An oxygen concentration in the capping pattern 130 and the second spacers 120 may be lower than an oxygen concentration in the first spacers 110. The difference in oxygen concentration may cause the second spacers 120 and the capping pattern 130 to have a different etch selectivity than the first spacers 110. Thus, when an etching process is subsequently performed, the top portions of the first spacers 110 may be protected against etching by the second spacers 120 and the capping pattern 130. In some embodiments, the capping pattern 130 and the second spacers 120 may not substantially include oxygen atoms. For example, the capping pattern 130 and the second spacers 120 may include SiN. The first spacers 110 may include a different material from that of the capping pattern 130 and the second spacers 120. The first spacers 110 may include oxygen atoms. For example, the first spacers 110 may include SiOCN.

The material of the first spacers 110 and the material of the second spacers 120 and the capping pattern 130 may differ in other respects besides oxygen concentration. In general, the material of the first spacers 110 may differ from the material of the second spacers 120 and the capping pattern 130 in any respect that causes the first spacers 110 to have an etch selectivity with respect to the second spacers 120 and the capping pattern 130 in a subsequent etch process.

The gate electrode GE may include at least one of a conductive metallic nitride (for example, titanium nitride and/or tantalum nitride) and a metal (for example, aluminum and/or tungsten), however, the inventive concepts are not limited thereto. The gate dielectric pattern 132 may include silicon oxide, hafnium oxide, silicate, zirconium oxide and/or zirconium silicate but the inventive concepts is not limited to those materials.

Source/drain regions SD may be provided in the active pattern AP at opposite sides of the gate structure GS. According to some embodiments, the source/drain regions SD may be provided in the active fin AF of the active pattern AP, but the inventive concepts are not limited thereto. A portion of the active pattern AP which is located under the gate structure GS and overlaps the gate structure GS (for example, a portion of the active fin AF) may be used as a channel region.

A lower interlayer insulating layer 140 may be provided on the substrate 100 and may cover the gate structure GS. A top surface of the capping pattern 130 may be substantially coplanar with a top surface of the lower interlayer insulating layer 140. The lower interlayer insulating layer 140 may include, for example, $SiO_2$. An upper interlayer insulating layer 150 may be provide on the lower interlayer insulating layer 140 and the upper interlayer insulating layer 150 may cover the top surface of the capping pattern 130. The upper interlayer insulating layer 150 may include, for example, $SiO_2$.

Contacts CT may be provided on opposite sides of the gate structure GS. The contacts CT may penetrate the upper interlayer insulating layer 150 and the lower interlayer insulating layer 140, and may be electrically connected to the substrate 100. The contacts CT may be electrically connected to the source/drain regions SD on opposite sides of the gate structure GS, respectively. The contacts CT may include a semiconductor, metal, metal silicide and/or conductive metal nitride that are doped.

Referring to FIG. 1, the gate structure GS may include a first part P1 that is disposed on the active pattern AP and a second part P2 that is disposed on the device isolation layer ST. The first part P1 is adjacent to the contacts CT and the second part P2 is spaced apart from the contacts CT. Referring to FIGS. 1 and 2A, in the first part P1, the sidewalls 130s of the capping pattern 130 and the outer sidewalls 120*j* of the second spacers 120 may directly contact the contacts CT. A portion of each of the first spacers 110 may be in contact with each of the contacts CT. For example, the contacts CT may contact the lower outer sidewalls 110*j*1 of the first spacers 110. The capping pattern 130 may have a width W along the first direction D1, and at the first part P1, an upper width of the capping pattern 130 may be smaller than a lower width of the capping pattern 130. In a sectional view, a portion of a sidewall of each contact CT may be coplanar with the sidewall 130*s* of the capping pattern 130 and the outer sidewall 120*j* of the second spacer 120*s*. In some embodiments, an upper portion of each contact CT may overlap the second spacers in a plan view. At the second part P2, the sidewalls 130*s* of the capping pattern 130 and the outer sidewalls 120*j* of the second spacers 120 may directly contact the lower interlayer insulating layer 140. Referring to FIGS. 1 and 2B, at the second part P2, the capping pattern 130 may have the same width W regardless of distance from the substrate 100. According to some embodiments, at the second part P2, the sidewall 130*s* of the capping pattern 130 may be substantially perpendicular to a top surface of the substrate 100.

Interconnection lines (not shown) connected to the contacts CT may be provided on the upper interlayer insulating layer 150. The interconnection lines may be electrically connected to the source/drain regions SD through the contacts CT.

FIGS. 3A through 7A are cross sectional views taken along the line I-I' of FIG. 1, that illustrate methods of manufacturing a semiconductor device in accordance with some embodiments of the inventive concepts. FIGS. 3B through 7B are cross sectional views taken along the line II-II' of FIG. 1, that illustrate methods of manufacturing a semiconductor device in accordance with some embodiments of the inventive concepts.

Figure 3A:
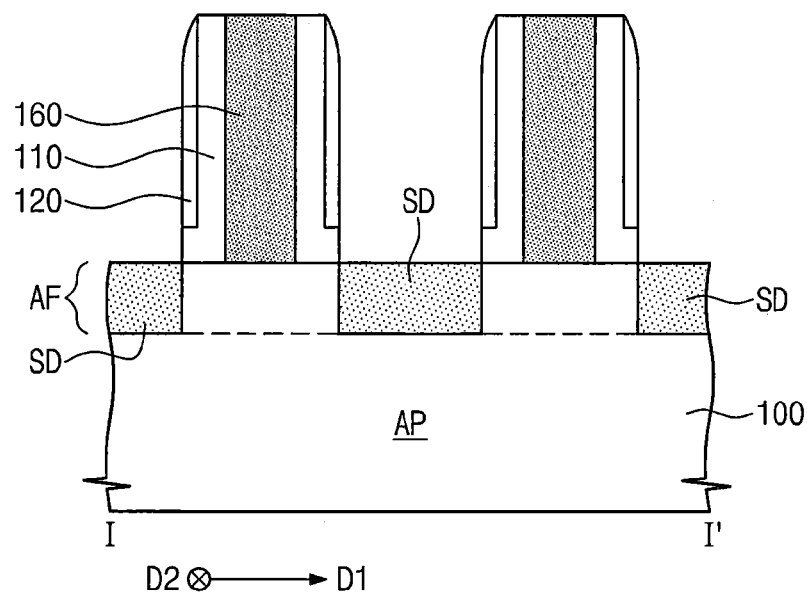
Figure 3B:
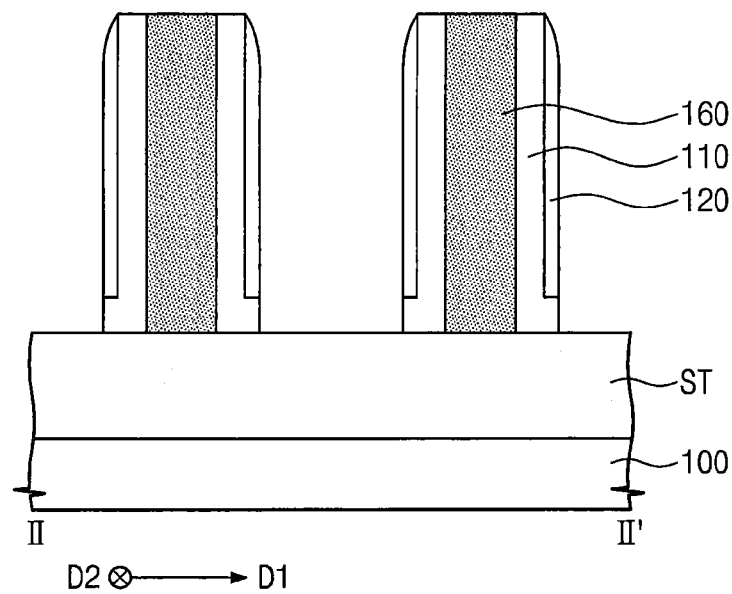

Referring to FIGS. 3A and 3B, a device isolation layer that defines an active pattern AP may be formed on a substrate 100. The device isolation layer ST may be formed by, for example, a STI (shallow trench isolation) process. According to some embodiments, the active pattern AP may include an upper region (hereinafter referred to as an active fin 'AF') that is exposed by the device isolation layer ST. The active pattern AP may be formed to extend in a first direction D1.

A sacrificial gate pattern 160 is formed on the substrate 100 to cross the active pattern AP and extends in a second direction D2. The sacrificial gate pattern 160 may cross the device isolation layer ST. A plurality of sacrificial gate patterns 160 may be provided. The sacrificial gate, patterns 160 may be formed to be spaced apart from one another along the first direction D1. Forming the sacrificial gate pattern 160 may include forming a sacrificial gate layer (not shown) on the substrate 100 and patterning the sacrificial gate layer. The sacrificial gate layer may include, for example, polysilicon.

First spacers 110 and second spacers 120 may be formed on opposite sidewalls of the sacrificial gate pattern 160. The first spacers 110 and the second spacers 120 may be formed on the active pattern AP and the device isolation layer ST. The first spacers 110 may be formed on opposite sidewalls of the sacrificial gate pattern 160. The second spacers 120 may be formed on opposite sidewalls of the sacrificial gate pattern 160 and may be spaced apart from the sacrificial gate pattern 160 with the first spacers 110 interposed therebetween. The first spacers 110 may include a material that is different from the material of the second spacers 120. For example, in some embodiments, an oxygen concentration in the first spacers 110 may be higher than an oxygen concentration in the second spacers 120. That is, the first spacers 110 may include oxygen atoms and the second spacers 120 may substantially not include oxygen atoms. As an example, the first spacers 110 may include SiCON and the second spacers 120 may include SiN. Forming the first spacers 110 and the second spacers 120 may include forming a first spacer layer (not shown) and a second spacer layer (not shown) on the substrate 100 on which the sacrificial gate pattern 160 is formed and anisotropically etching the first spacer layer and the second spacer layer. Accordingly, top surfaces and lower sidewalls of the first spacers 110 may be exposed by the second spacers 120.

Source/drain regions SD may be formed in the active pattern AP adjacent to the sidewalls of the sacrificial gate pattern 160. For example, forming the source/drain regions SD may include performing an epitaxial growth process on the active pattern AP adjacent to both sidewalls of the sacrificial gate pattern 160. Alternatively, the source/drain regions SD may be formed by performing an ion implantation process on the active pattern AP adjacent to both sidewalls of the sacrificial gate pattern 160.

Figure 4A:
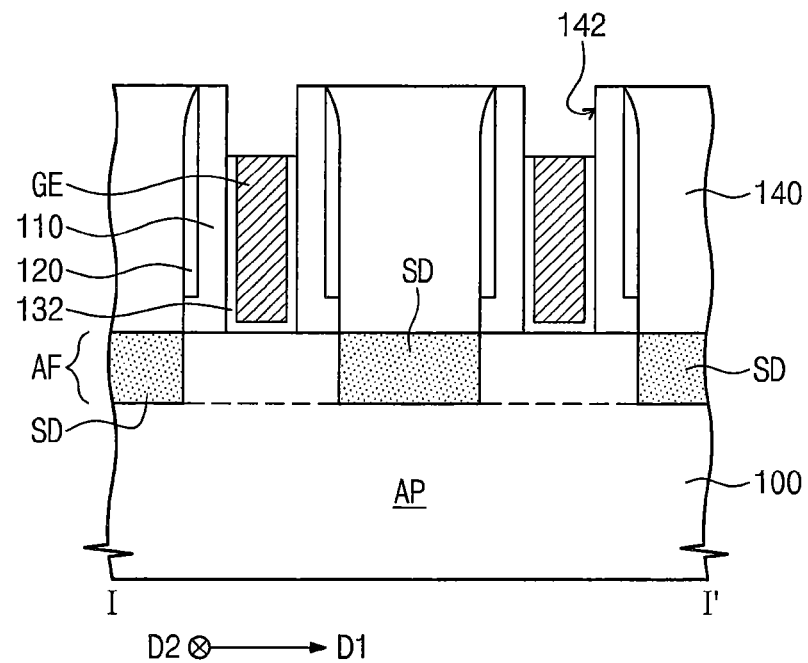
Figure 4B:
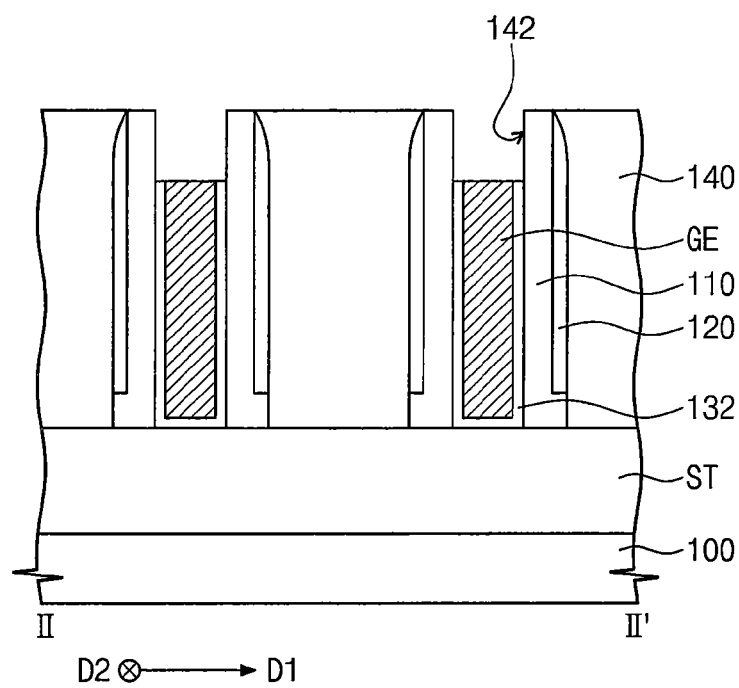

Referring to FIGS. 4A and 4B, a lower interlayer insulating layer 140 may be formed on the substrate 100 and may cover the sacrificial gate pattern 160 and the source/drain regions SD. The lower interlayer insulating layer 140 may include, for example, $SiO_2$. The lower interlayer insulating layer 140 may be etched to expose a top surface of the sacrificial gate pattern 160. After that, a gap region 142 may be formed between the first spacers 110 by removing the sacrificial gate pattern 160. Forming the gap region 142 may include etching the sacrificial gate pattern 160 by performing an etching process having an etching selectivity with respect to the lower interlayer insulating layer 140, the first spacers 110 and the second spacers 120.

A gate dielectric pattern 132 and a gate electrode GE may be formed in the gap region 142. Forming the gate dielectric pattern 132 and the gate electrode GE may include forming a gate dielectric layer (not shown) filling a portion of the gap region 142 on the lower interlayer insulating layer 140, forming a gate electrode layer (not shown) filling the remaining portion of the gap region 142 on the gate dielectric layer, and planarizing the gate dielectric layer and the gate electrode layer to expose a top surface of the lower interlayer insulating layer 140. By the planarization process, top surfaces of the first spacers 110 and the second spacers 120 may be exposed and may be coplanar. After that, the gate electrode GE may be formed by etching an upper portion of the gate electrode layer until the gate electrode layer has a desired thickness in the gap region 142. In addition, an upper portion of the gate dielectric layer that is not covered by the gate electrode GE is etched to form the gate dielectric pattern 132. The gate dielectric pattern 132 may be interposed between the gate electrode GE and the substrate 100 and may extend between the gate electrode GE and the first spacers 110. According to some embodiments, a top surface of the gate electrode GE and a top surface of the gate dielectric pattern 132 may be located on the same plane. For example, the top surface of the gate electrode GE and the top surface of the gate dielectric pattern 132 may be located at substantially the same level from the substrate 100.

Figure 5A:
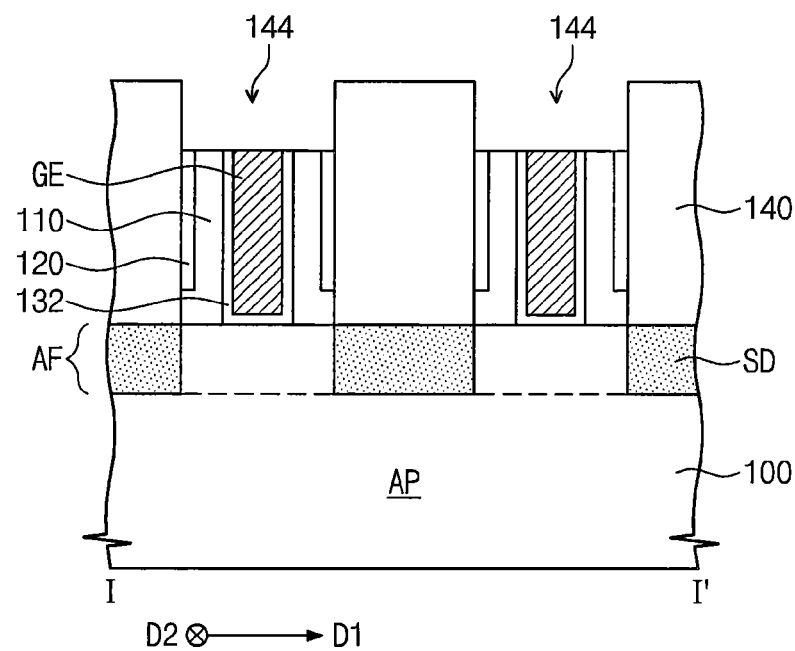
Figure 5B:
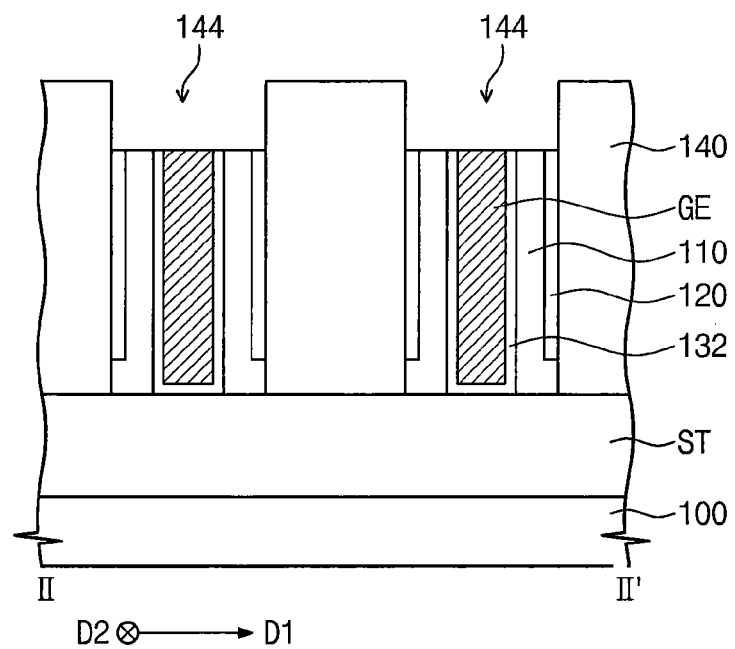

Referring to FIGS. 5A and 5B, upper portions of the first spacers 110 and the second spacers 120 may be removed to form a recess region 144 exposing an inner sidewall of the lower interlayer insulating layer 140. The upper portions of the first spacers 110 and the second spacers 120 may be removed by performing an etching process having an etching selectivity with respect to the lower interlayer insulating layer 140, the gate electrode GE and the gate dielectric pattern 132. According to some embodiments, after the etching process, top surfaces of the first spacers 110 and the second spacers 120 may be coplanar with the top surface of the gate electrode GE. For example, the top surfaces of the first spacers 110 and the second spacers 120 and the top surface of the gate electrode GE may be located at the same level above the substrate 100. The recess region 144 may be defined by the inner sidewall of the lower interlayer insulating layer 140, the top surface of the gate electrode GE, the top surface of the gate dielectric pattern 132, the top surfaces of the first surfaces 110 and the top surfaces of the second spacers 120.

Figure 6A:
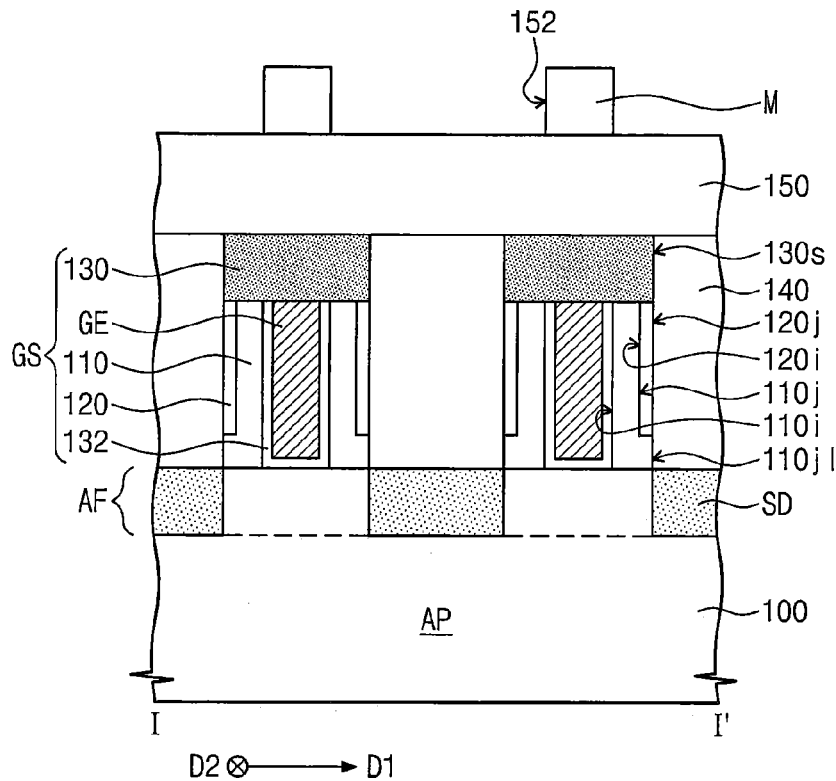
Figure 6B:
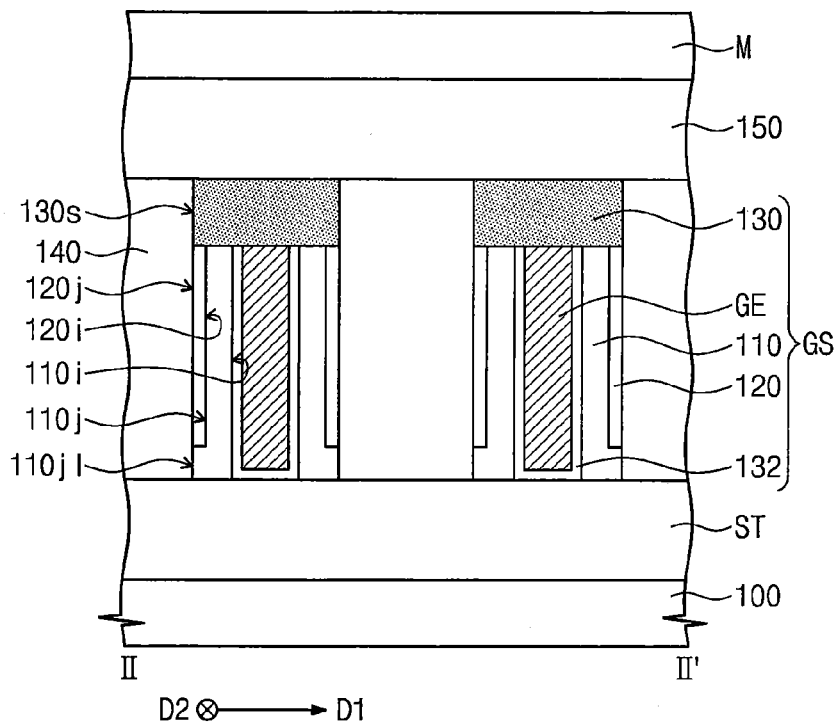

Referring to FIGS. 6A and 6B, a capping pattern 130 may be formed in the recess region 144. The capping pattern 130 may be formed by forming a capping layer (not shown) that fills the recess region 144 on the lower interlayer insulating layer 140 and planarizing the capping layer to expose the top surface of the lower interlayer insulating layer 140.

Because the capping layer is formed in the recess region 144 in the insulating layer 140 that remains when the upper portions of the first and second spacers are removed, the capping pattern 130 may be self-aligned to the lower outer sidewall of the first spacers 110 and the out sidewall of the second spacers 120.

Each of the second spacers 120 may have an inner sidewall 120i adjacent to the gate electrode GE and an outer sidewall 120j facing the inner sidewall 120i. Each of the first spacers 110 may have an inner sidewall 110i which is in contact with the gate dielectric pattern 132 and an outer sidewall 110j which faces the inner sidewall 110i and is in contact with the inner sidewall 120i of each second spacer 120. A lower outer sidewall 110j1 of the each first spacer 110 may be exposed by the each second spacer 120. The lower outer sidewall 110j1 of the each first spacer 110 may be aligned with the outer sidewall 120j of the each second spacer 120.

Both sidewalls 130s of the capping pattern 130 may be aligned with the outer sidewalls 120j of the second spacers 120, respectively. The capping pattern 130 may include the same material as the second spacers 120. An oxygen concentration in the capping pattern 130 may be lower than the oxygen concentration in the first spacers 110. The capping pattern 130 may not substantially include oxygen atoms. For example, the capping pattern 130 may include SiN. The gate electrode GE, the gate dielectric layer 132, the first spacers 110, the second spacers 120 and the capping pattern 130 may define a gate structure GS.

An upper interlayer insulating layer 150 may be formed on the lower interlayer insulating layer 140 and may cover the gate structure GS. The upper interlayer insulating layer 150 may include, for example, $SiO_2$. Mask patterns M may be formed on the upper interlayer insulating layer 150. The mask patterns M may include a material having an etching selectivity with respect to the upper interlayer insulating layer 150 and the lower interlayer insulating layer 140. The mask patterns M may include openings 152 defining a region where contacts CT are formed.

Figure 7A:
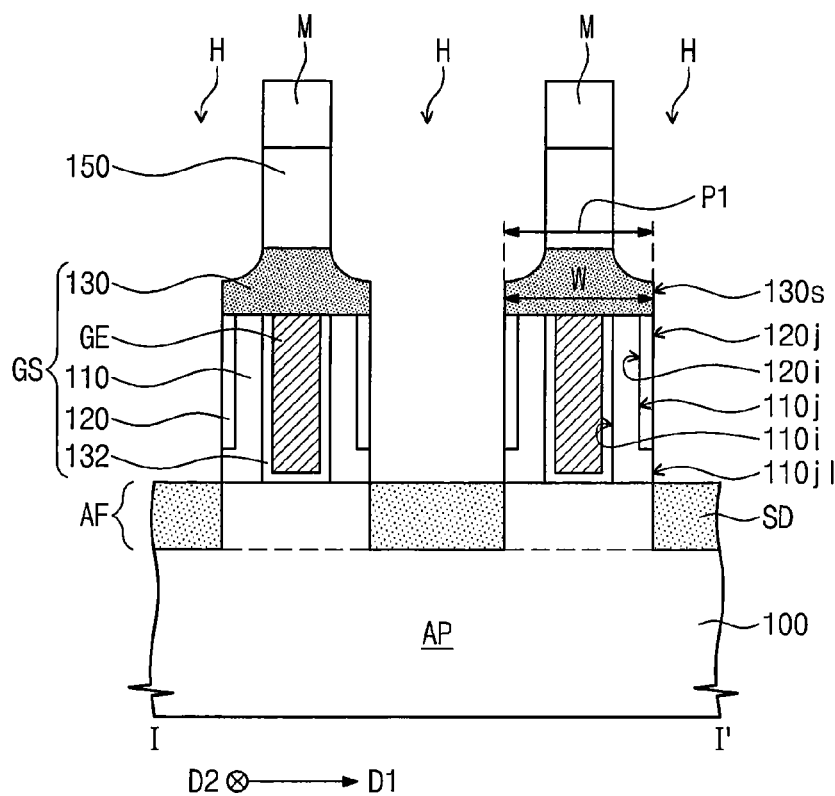
Figure 7B:
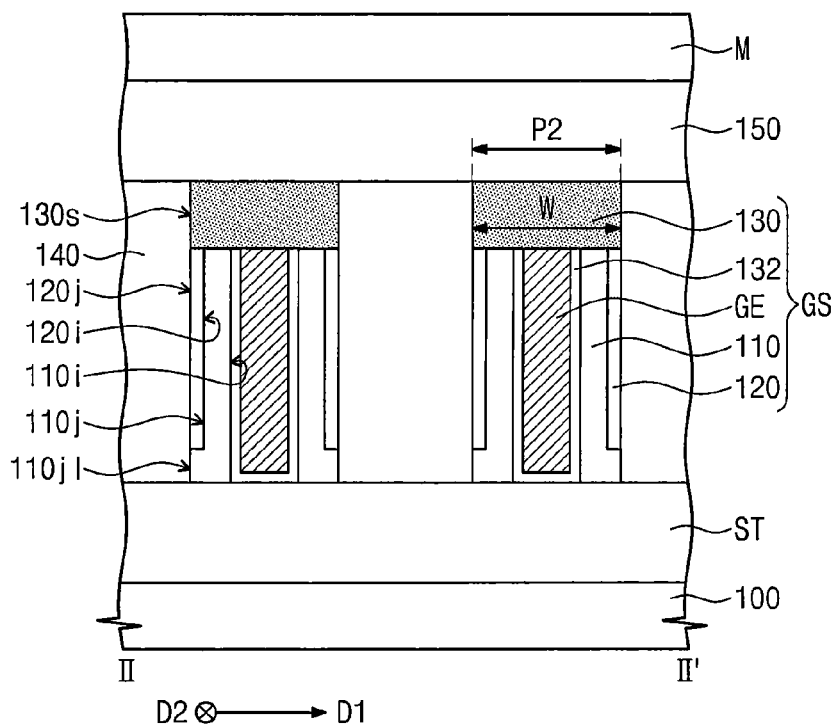

Referring to FIGS. 7A and 7B, the upper interlayer insulating layer 150 and the lower interlayer insulating layer 140 may be etched using the mask patterns M as an etching mask to form contact holes H that expose the substrate 100. The contact holes H may expose the source/drain regions SD at opposite sides of the gate structure GS.

The etching process of forming the contact holes H may be performed using an etching condition having an etching selectivity with respect to the capping pattern 130, the first spacers 110, and the second spacers 120. That is, during the etching process, an etch rate of each of the capping pattern 130, the first spacers 110, and the second spacers 120 may be lower than an etch rate of the upper interlayer insulating layer 150 and the lower interlayer insulating layer 140. During the etching process, an etching selectivity of each of the capping pattern 130 and the second spacers 120 may be greater than an etching selectivity of the first spacers 110. That is, during the etching process, an etch rate of each of the capping pattern 130 and the second spacers 120 may be lower than an etch rate of the first spacers 110. For example, the etching process may be an anisotropic dry etching process using a fluorine-based etching gas, such as $C_4F_6$. Because the oxygen concentration of the capping pattern 130 and the second spacers 120 is lower than oxygen concentration of the first spacers 110, the etch rate of each of the capping pattern 130 and the second spacers 120 may be lower than an etch rate of the first spacers 110. The capping pattern 130 and the second spacers 120 may be formed of SiN and the first spacers 110 may be formed of SiCON. In this case, since concentration of oxygen atom, which reacts to the etching gas $C_4F_6$, in the capping pattern 130 and the second spacers 120 is lower than concentration of oxygen atom in the first spacers 110, the etch rate of each of the capping pattern 130 and the second spacers 120 may be lower than the etch rate of the first spacers 110.

During the etching process, upper portions of the first spacers 110 may be covered by the capping pattern 130 and the second spacers 120, and thus, may not be exposed to the etching gas.

If the capping pattern 130 were limited to cover the top surfaces of the gate electrode GE and the gate dielectric pattern 132 and did not cover the first spacers 110, then the upper portions of the first spacers 110 would be exposed to the etching gas during the etching process. In that case, because of the presence of oxygen atoms in the first spacers 110 which would react to the etching gas, the first spacers 110 may be easily damaged during the etching process. That may, in turn, cause the gate electrode GE to be exposed by the etching process, which may result in the formation of an electrical short between the gate electrode GE and contacts CT that are subsequently formed in the contact holes H.

However, according to some embodiments of the inventive concepts, the capping pattern 130 may extend from the top surfaces of the gate electrode GE and the gate dielectric pattern 132 to the top surfaces of the first spacers 110 and the second spacers 120. The capping pattern 130 may cover the first spacers 110 and at least a portion of the second spacers 120. During a subsequent etching process, upper portions of the first spacers 110 may be covered by the capping pattern 130 and the second spacers 120, and thus may not be exposed to the etching gas. During the etching process the capping pattern 130 and the second spacers 120 may have an etching selectivity that is higher than the first spacers 110. That is, the capping pattern 130 and the second spacers 120 may be less susceptible to the etching process than the first spacers 110. Thus, damage to the first spacers 110 during the etching process may be reduced. Moreover, the gate electrode GE may be protected from being exposed during the etching process. Accordingly, it may be possible to avoid or prevent the formation of an electrical short between the gate electrode GE and the contacts CT that are subsequently formed in the contact holes H.

The gate structure GS may include a first part P1 on the active pattern AP and a second part P2 on the device isolation layer ST. The first part P1 is adjacent to the contact holes H and the second part P2 is spaced apart from the contact holes H. In the first part P1, the sidewalls 130s of the capping pattern 130 and the outer sidewalls 120j of the second spacers 120 may be exposed by the contact holes H. The lower outer sidewalls 110j1 of the first spacers 110 may also be exposed by the contact holes H. In the second part P2, the opposite sidewalls 130s of the capping pattern 130, the outer sidewalls 120j of the second spacers 120 and the lower outer sidewalls 110j1 of the first spacers 110 may be covered by the lower interlayer insulating layers 140.

The capping pattern 130 may have a width W along the first direction D1. According to some embodiments, an upper portion of the capping pattern 130 may be partially etched during the etching process, and thereby in the first part P1, a width W of the upper portion of the capping pattern 130 may be smaller than a width W of a lower portion of the capping pattern 130. In the second part P2, a width W of the upper portion of the capping pattern 130 may be substantially the same as a width W of the lower portion of the capping pattern 130, because the contact holes are not formed in the second part P2. According to some embodiments, in the second part P2, the opposite sidewalls 130s of the capping pattern 130 may be substantially perpendicular to the top surface of the substrate 100.

Referring again to FIGS. 2A and 2B, the mask patterns M may be removed. After the mask patterns M are removed, contacts CT may be formed in the contact holes H. The contacts CT may be formed by forming a conductive layer filling the contact holes H on the upper interlayer insulating layer 150 and planarizing the conductive layer to expose a top surface of the upper interlayer insulating layer 150. The contacts CT may include at least one of doped semiconductor, metal, metal silicide and/or conductive metal nitride. A sidewall of each contact CT may be coplanar with the sidewall 130s of the capping pattern 130 and the outer sidewall 120j of each second spacer 120. In the first part P1, the sidewalls 130s of the capping pattern 130 and the outer sidewalls 120j of second spacers 120 may contact the contacts CT. A portion of each of the first spacers 110 may be in contact with the contacts CT. For example, the contacts CT may be in contact with the lower outer sidewalls 110i1 of the first spacers 110.

Interconnection lines (not shown) connected to the contacts CT may be formed on the upper interlayer insulating layer 150. The interconnection lines may be electrically connected to the source/drain regions SD through the contacts CT.

According to some embodiments of the inventive concepts, a capping pattern 130 is provided on the gate electrode GE and may extend onto the top surfaces of the first and second spacers 110 and 120 that are provided on opposite sidewalls of the gate electrode GE. During the process of etching the contact holes H on opposite sides of the gate structure GS, the upper portions of the first spacers 110 may be covered by the capping pattern 130 and the second spacers 120, and so the upper portions of the first spacers 110 may not be exposed to an etching gas. Since the capping pattern 130 and the second spacers 120 have a high etching selectivity with respect to the first spacers 110, damage to the first spacers 110 during the etching process, and in particular damage to upper portions of the first spacers 110, may be reduced. Accordingly, the gate electrode GE may not be exposed by the etching process, and the likelihood of the formation of an electrical short between the gate electrode GE and the contacts CT to be formed in the contact holes H may be reduced. Accordingly, a semiconductor device having superior reliability may be manufactured.

Figure 8:
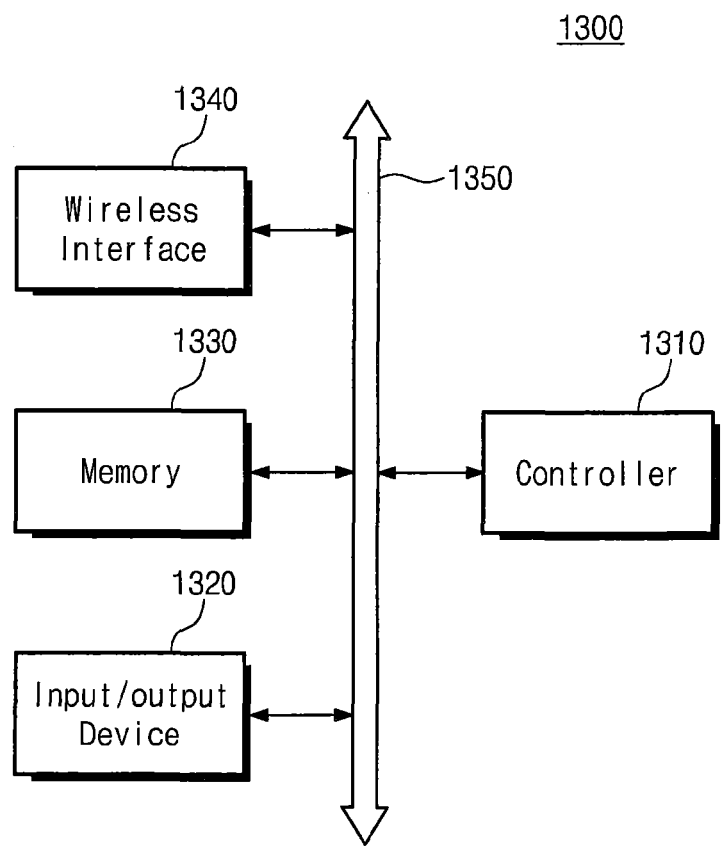
FIGS. 8 and 9 are drawings for explaining an electronic device and a memory system that include a semiconductor device in accordance with embodiments of the inventive concepts, respectively.
Figure 9:
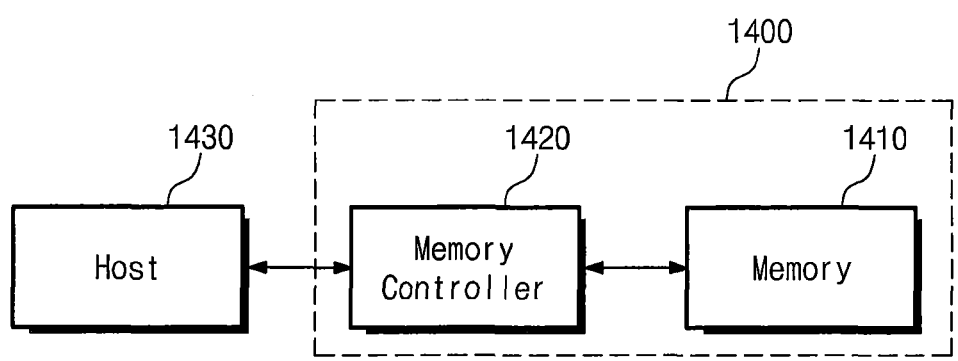

FIGS. 8 and 9 are drawings that illustrate an electronic device and a memory system that include a semiconductor device in accordance with embodiments of the inventive concepts respectively.

Referring to FIG. 8, an electronic device 1300 including a semiconductor device in accordance with embodiments of the inventive concepts may be a PDA, a laptop computer, a portable computer, a web tablet, a wireless phone, a cellular phone, a digital music player, a wired and wireless electronic device or a complex electronic device including at least two thereof. The electronic device 1300 may include a controller 1310, an input/output device 1320 such as a keypad, a keyboard, etc., a memory 1330 and a wireless interface 1340, which are coupled with each other through a bus 1350. The controller 1310 may include at least one microprocessor, digital signal processor, micro controller or similar things thereto. The memory 1330 may be used to store a command being executed by the controller 1310. The memory 1330 may be used to store user data. The controller 1310 and/or the memory 1330 may include a semiconductor device in accordance with embodiments of the inventive concepts. The electronic device 1300 may use a wireless interface 1340 to transmit data to a wireless communication network communicating using a RF signal or receive data from the wireless communication network. For example, the wireless interface 1340 may include an antenna, a wireless transceiver, etc. The electronic device 1300 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE, 802.20, GPRS, iBurst, WiBro, WiMAX, WiMAX-Advanced, UMTS-TDD, HSPA, EVDO, LTE-Advanced, MMDS, etc.

Referring to FIG. 9, semiconductor memories in accordance with embodiments of the inventive concepts may be used to realize a memory system. The memory system 1400 may include a memory device 1410 for storing large amounts of data and a memory controller 1420. The memory controller 1420 controls the memory 1410 to read or write data stored in the memory device 1410 in response to a read/write request of a host 1430. The memory controller 1420 may constitute an address mapping table for mapping an address being provided from the host 1430, for example, a mobile device or a computer system to a physical address. The memory device 1410 and/or the memory controller 1420 may include a semiconductor device in accordance with embodiments of the inventive concepts.

The semiconductor devices disclosed in the embodiments described above may be embodied using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Although the present inventive concepts has been described in connection with the embodiments of the present inventive concepts illustrated in the accompanying drawings, it is not limited thereto. It will be apparent to those skilled in the art that various substitutions, modifications and changes may be made thereto without departing from the scope and spirit of the inventive concepts.

What is claimed is:

1. A method of forming a semiconductor device, comprising:
   forming a gate electrode on a substrate;
   forming a first spacer on a sidewall of the gate electrode;
   forming a gate dielectric pattern between the gate electrode and the first spacer;
   forming a second spacer that is spaced apart from the gate electrode on an outer sidewall of the first spacer, wherein the first spacer is interposed between the second spacer and the gate electrode;
   forming a capping pattern on top surfaces of the gate electrode, the first spacer and the second spacer,
   wherein a sidewall of the capping pattern is vertically aligned with an outer sidewall of the second spacer; and
   forming a contact adjacent to a sidewall of the gate electrode and electrically connected to the substrate,
   wherein the contact is in direct contact with the sidewall of the capping pattern, the outer sidewall of the second spacer, and the lower portion of the outer sidewall of the first spacer.

2. The method of claim 1, wherein a lower portion of the outer sidewall of the first spacer is exposed by the second spacer and is aligned with the sidewall of the capping pattern.

3. The method of claim 1, further comprising:
   forming an insulating layer on the substrate including the gate electrode, the capping pattern and the first and second spacers; and
   etching the insulating layer to form a contact hole adjacent the capping pattern and the first and second spacers, wherein the capping pattern and the second spacer have an etch selectivity with respect to the first spacer.

4. The method of claim 3, wherein etching the insulating layer comprises anisotropically etching the insulating layer using a fluorine-based etching gas.

5. The method of claim 4, further comprising forming a contact filling the contact hole,
   wherein an upper portion of the contact overlaps with the second spacer in a plan view.

6. The method of claim 1, wherein the top surfaces of the gate electrode, the first spacer and the second spacer are coplanar.

7. The method of claim 1, wherein the capping pattern is in contact with the top surfaces of the gate electrode, the first spacer and the second spacer.

8. The method of claim 1, wherein the second spacer and the capping pattern comprise the same material, and
   wherein the first spacer comprises a different material from the second spacer and the capping pattern.

9. The method of claim 8, wherein an oxygen concentration in the second spacer and the capping pattern is lower than an oxygen concentration in the first spacer.

10. The method of claim 8, wherein the first spacer comprises SiOCN and the second spacer and the capping pattern comprise SiN.

11. The method of claim 1, wherein the gate dielectric pattern extends between the substrate and the gate electrode.

12. A method of forming a semiconductor device comprising:
    forming a dummy gate pattern on a substrate;
    forming first spacers on opposite sidewalls of the dummy gate pattern;
    forming second spacers on outer sidewalls of the first spacers;
    forming an interlayer insulating layer on the dummy gate pattern, the first spacers, the second spacers, and the substrate;
    removing the dummy gate pattern to form a gap region between the first spacers;
    forming a gate electrode in a portion of the gap region;
    removing upper portions of the first spacers and upper portions of the second spacers to form a recess region that exposes an inner sidewall of the interlayer insulating layer; and
    forming a capping pattern in the recess region to cover the gate electrode, the first spacers, and the second spacers.

13. The method of claim 12, further comprising forming a contact hole in the interlayer insulating layer by patterning the interlayer insulating layer adjacent to a sidewall of the gate electrode,
    wherein patterning the interlayer insulating layer comprises etching the interlayer insulating layer using an etching condition having an etching selectivity with respect to the capping pattern and the second spacers.

14. The method of claim 12, wherein forming a gate electrode in a portion of the gap region comprises;
    forming a gate electrode layer filling the gap region;
    planarizing the gate electrode layer until a top surface the interlayer insulating layer is exposed; and
    removing the upper portion of the gate electrode layer in the gap region.

15. A method of forming a semiconductor device comprising:
    forming a device isolation layer defining an active pattern which protrudes from a substrate;
    forming a gate electrode that crosses the active pattern and the device isolation layer;
    forming first spacers on opposite sidewalls of the gate electrode;
    forming second spacers on outer sidewalls of the first spacers, wherein the first spacers are interposed between the second spacers and the gate electrode; and
    forming a capping pattern on top surfaces of the gate electrode, the first spacers and the second spacers,
    wherein the first and second spacers and the capping pattern cross the active pattern and the device isolation layer,
    wherein each second spacer has an inner sidewall adjacent to the gate electrode and an outer sidewall facing the inner sidewall, and
    wherein the outer sidewalls of the second spacers are aligned with outer sidewalls of the capping pattern.

16. The method of claim 15, wherein the capping pattern is in contact with top surfaces of the gate electrode, the first spacers, and the second spacers.

17. The method of claim 15, further comprising forming contacts adjacent to the gate electrode and that are electrically connected to the active pattern, wherein the contacts are in direct contact with the capping pattern, the second spacers, and lower portions of the first spacers.

18. The method of claim 15, further comprising:
    forming an interlayer insulating layer over the gate electrode, the first spacers, the second spacers, and the capping pattern on the substrate; and
    forming contacts in the interlayer insulating layer adjacent to the sidewalls of the gate electrode,
    wherein the capping pattern, the second spacers, and lower portions of the first spacers are in contact with the contacts on the active pattern, and wherein the capping pattern, the second spacers, and the lower portions of the first spacers are in contact with the interlayer insulating layer on the device isolation layer.

19. The method of claim 18, wherein the capping pattern has a width along a lengthwise direction in which the active pattern extends, wherein on the active pattern, a width of an upper portion of the capping pattern is smaller than a width of a lower portion of the capping pattern, and wherein on the device isolation layer, the width of the upper portion of the capping pattern is the same as the width of the lower portion of the capping pattern.

\* \* \* \* \*